(12) United States Patent
Lacourt

(10) Patent No.: US 7,022,402 B2
(45) Date of Patent: Apr. 4, 2006

(54) DIELECTRIC SUBSTRATES COMPRISING A POLYMIDE CORE LAYER AND A HIGH TEMPERATURE FLUOROPOLYMER BONDING LAYER, AND METHODS RELATING THERETO

(75) Inventor: Philip Roland Lacourt, Chillicothe, OH (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/620,089

(22) Filed: Jul. 14, 2003

(65) Prior Publication Data

US 2005/0013998 A1 Jan. 20, 2005

(51) Int. Cl.
*B32B 1/00* (2006.01)
*B32B 7/12* (2006.01)
*B32B 15/02* (2006.01)
*B32B 27/08* (2006.01)

(52) U.S. Cl. ............... 428/215; 428/336; 428/337; 428/380; 428/422; 428/473.5

(58) Field of Classification Search ............ 428/215, 428/336, 337, 377, 380, 383, 421, 422, 473.5
See application file for complete search history.

(56) References Cited

U.S. PATENT DOCUMENTS

| | | | |
|---|---|---|---|
| 3,616,177 A | 10/1971 | Gumerman | |
| 4,271,226 A * | 6/1981 | Herbreteau | ............ 428/220 |
| 4,628,003 A | 12/1986 | Katz | |
| 5,106,673 A | 4/1992 | Effenberger et al. | |
| 5,171,635 A | 12/1992 | Randa | |
| 5,220,133 A | 6/1993 | Sutherland et al. | |
| 5,238,748 A | 8/1993 | Effenberger et al. | |
| 5,371,088 A | 12/1994 | Treiber et al. | |
| 5,380,820 A | 1/1995 | Ohta et al. | |
| 5,381,511 A | 1/1995 | Bahar et al. | |
| 5,399,434 A | 3/1995 | Katz et al. | |
| 5,519,172 A | 5/1996 | Spencer et al. | |
| 5,846,355 A | 12/1998 | Spencer et al. | |

* cited by examiner

*Primary Examiner*—Ramsey Zacharia

(57) ABSTRACT

An asymmetric multi-layer insulative film of improved internal adhesive strength is made by combining a layer of polyimide and a high-temperature bonding layer, the high-temperature bonding layer being derived from a high temperature base polymer made of poly(tetrafluoroethylene-co-perfluoro[alkyl vinyl ether]) (PFA) and optionally blended with from 0–60 weight percent poly(tetrafluoroethylene-co-hexafluoropropylene) (FEP). The polyimide and high-temperature bonding layer laminate optionally also contains a layer of unsintered, partially sintered, or totally sintered polytetrafluoroethylene (PTFE) bonded directly to the high-temperature bonding layer. In addition, the polyimide high-temperature bonding layer laminate may be adhered to a poly(tetrafluoroethylene-co-hexafluoropropylene) (FEP) adhesive primer layer to more effectively bond the polyimide core layer to the high-temperature bonding layer. This type of primer layer may also be used as a polyimide-to-metal bonding layer to assist bonding of the polyimide to a metal wire or metal layer.

14 Claims, 1 Drawing Sheet

DIELECTRIC SUBSTRATES COMPRISING A POLYIMIDE CORE LAYER AND A HIGH TEMPERATURE FLUOROPOLYMER BONDING LAYER, AND METHODS RELATING THERETO

FIELD OF THE INVENTION

The present invention relates generally to multilayer substrates useful for supporting, insulating and/or protecting electrically conductive materials, particularly: (i.) wires (or cables) in aerospace, high voltage machinery or other high performance (electrical) insulation type applications; and/or (ii.) electronic circuitry in high speed digital or similar type applications. More specifically, the multilayer substrates of the present invention have at least one polyimide core layer and at least one fluoropolymer high-temperature bonding layer, which in combination generally provide advantageous mechanical, thermal and electrical properties.

BACKGROUND

U.S. Pat. No. 3,616,177 discloses a laminar composite comprising a polyimide layer having FEP, which is copolymer of tetrafluoroethylene (TFE) and hexafluoropropylene (HFP), coated on one or both sides and having a polytetrafluoroethylene (PTFE) polymer exterior surface layer.

U.S. Pat. No. 4,628,003 discloses a heat-sealable, high-temperature laminate composite comprising a polyimide interior layer between fluoropolymer layers, where the fluoropolymer layers have from 1 to 20 weight percent of a finely divided inorganic pigment material.

U.S. Pat. No. 5,238,748 discloses an insulation wrap having a polyimide layer and one or more layers comprising a blend of PTFE and fluorinated copolymer.

BRIEF DESCRIPTION OF THE DRAWINGS

FIG. 1 illustrates a wrap having no overlap, although as a practical matter, the dielectric substrates of the present invention would typically be wrapped around a wire or cable in an overlapping fashion.

SUMMARY OF THE INVENTION

Figure 1:
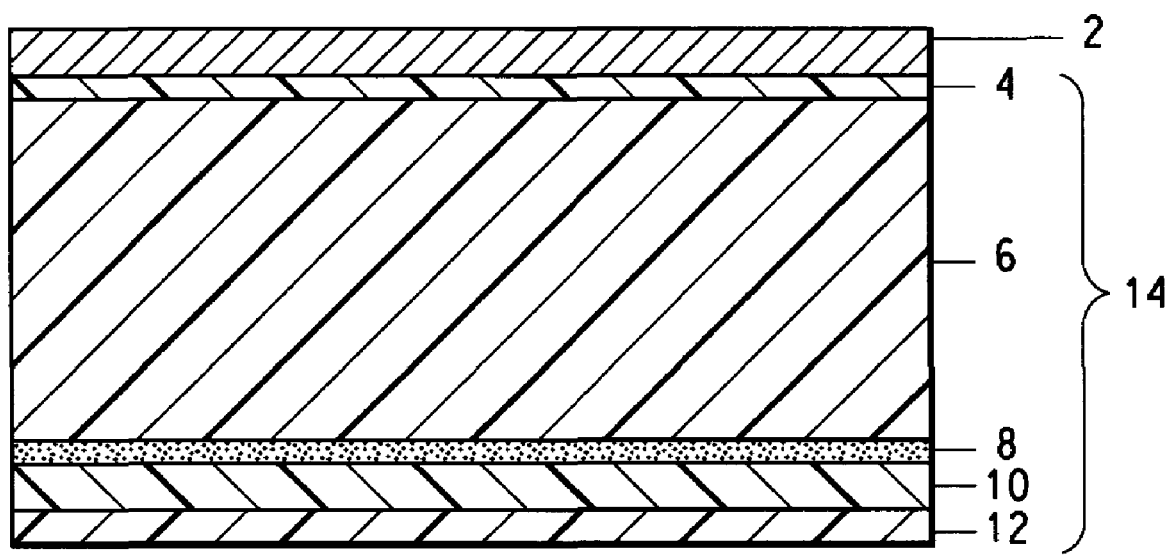
FIG. 1 illustrates a dielectric substrate in accordance with the present invention wrapped around a conductive wire or cable. For simplicity (i.e., to avoid unnecessary confusion)

The multilayer compositions of the present invention have at least two layers and may also include additional optional layers, as follows:
  i. a polyimide core layer;
  ii. a fluoropolymer high-temperature bonding layer having a base polymer comprising copolymer of TFE and perfluoro(alkyl vinyl ether) (PFA) and optionally blended with poly(tetrafluoroethylene-co-hexafluoropropylene) ("FEP");
  iii. optionally, a polyimide-to-metal ("PTM") bonding layer comprising a poly(tetrafluoroethylene-co-hexafluoropropylene) ("FEP") base polymer (generally useful for bonding the polyimide core layer to a conductive metal);
  iv. optionally, an adhesive primer layer comprising a poly(tetrafluoroethylene-co-hexafluoropropylene) ("FEP") base polymer (generally useful for bonding the high temperature fluoropolymer bonding layer in (ii) to the polyimide core layer in (i)); and,
  v. optionally, an exterior layer comprising a (wholly or partially) sintered resin having a polytetrafluoroethylene ("PTFE") base polymer (generally useful as the outermost layer).

The high temperature bonding layer listed as "ii" above (optionally in combination with the adhesive primer layer listed as "iv" above) when used together generally provides the dielectric substrate with improved resistance to delamination. Improved delamination resistance, particularly between the polyimide core layer (listed as "i" above) and the optional exterior sintered fluoropolymer layer (listed as "v" above), has been discovered to provide improved resistance to mechanical scrape abrasion and cut-through of the laminate system. Such improved resistance (to delamination and scrape abrasion) can be very important in applications such as aircraft wire insulation or the like. Also, with overall improved (direct or indirect) bond strength between the exterior layer and the polyimide layer, the substrates of the present invention are generally more easily stripped from a wire without (unwanted) delamination of the outer layers (from the inner insulation layers) that would otherwise require additional wire stripping.

DETAILED DESCRIPTION OF THE PREFERRED EMBODIMENT(S)

For purposes of the present invention, the following definitions are intended:

1. "Base polymer" as used herein is intended to mean the dominant polymer component (at least 50, 55, 60, 65, 70, 75, 80, 85, 90, 95 or 100 weight percent) of all polymers present in a composition.

2. "PFA" is intended to mean poly(tetrafluoroethylene-co-perfluoro[alkyl vinyl ether]), including variations or derivatives thereof, having the following moiety representing at least 50, 60, 70, 80, 85, 90, 95, 96, 97, 98, 99 or about 100 weight percent of the entire polymer:

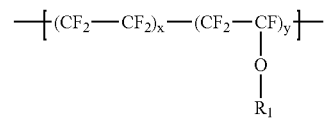

where $R_1$ is $C_nF_{2n+1}$, where n can be any natural number equal to or greater than 1 including up to 20 or more, typically n is equal to 1 to three, where x and y are mole fractions, where x is in a range from 0.95 to 0.99, typically 0.97, and where y is in a range from 0.01 to 0.05, typically 0.03, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

3. "FEP" is intended to mean poly(tetrafluoroethylene-co-hexafluoropropylene) [a.k.a. poly(tetrafluoroethylene-co-hexafluoropropylene)copolymer], derived in whole or in part from tetrafluoroethylene and hexafluoropropylene, including variations or derivatives thereof, having the following moiety

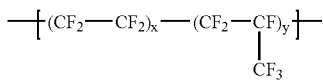

representing at least 50, 60, 70, 80, 85, 90, 95, 96, 97, 98, 99 or about 100 weight percent of the entire polymer:

where x and y are mole fractions, where x is in a range from 0.85 to 0.95, typically 0.92, and where y is in a range from 0.05 to 0.15, typically 0.08, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

The FEP copolymer used in the present invention can be derived directly or indirectly from: (i.) 50, 55, 60, 65, 70 or 75% to about 75, 80, 85, 90 or 95% tetrafluoroethylene; and (ii.) 5, 10, 15, 20, or 25% to about 25, 30, 35, 40, 45 or 50% (generally 7 to 27%) hexafluoropropylene. Such FEP copolymers are well known and are described in U.S. Pat. Nos. 2,833,686 and 2,946,763.

4. "PTFE" is intended to mean polytetrafluoroethylene, including variations or derivatives thereof, derived in whole or in part from tetrafluoroethylene and having the following moiety representing at least 50, 60, 70, 80, 85, 90, 95, 96, 97, 98, 99 or about 100 weight percent of the entire polymer:

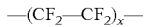

where x is equal to any natural number between 50 and 500,000.

5. "ETFE" is intended to mean poly(ethylene-co-tetrafluoroethylene), including variations or derivatives thereof, derived in whole or in part from ethylene and tetrafluoroethylene and having the following moiety representing at least 50, 60, 70, 80, 85, 90, 95, 96, 97, 98, 99, or about 100 weight percent of the entire polymer:

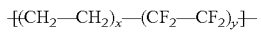

where x and y are mole fractions, where x is in a range from 0.40 to 0.60, typically 0.50, and where y is in a range from 0.40 to 0.60, typically 0.50, and where the melt flow rate, described in ASTM D 1238, is in a range of from 1 to 100 (g/10 min.), preferably 1 to 50 (g/10 min.), more preferably, 2 to 30 (g/10 min.), and most preferably 5 to 25 (g/10 min.).

Overview of a Wire or Cable Wrap in Accordance with the Present Invention:

Asymmetric multi-layer composites in accordance with the present invention are generally useful for insulating electrical conductors, particularly electrical wires and cables, and can generally be manufactured by combining a layer of polyimide with at least one layer of fluoropolymer.

In one embodiment, illustrated in FIG. 1, a multilayer polyimide and fluoropolymer substrate 14 in accordance with the present invention is sealed around a wire or cable 2. In this embodiment, the polyimide core layer 6 generally provides the dielectric substrate with mechanical toughness and dielectric strength at high temperatures. The optional polyimide-to-metal (PTM) layer 4 generally provides improved adhesion of the polyimide core layer to the metal wire or surface. The optional adhesive primer layer 8 generally provides improved adhesive strength between the high-temperature bonding layer 10 and the polyimide core layer 6. The high-temperature bonding layer 10 generally provides for improved mechanical resistance to scrape abrasion and cut through. The optional outer PTFE layer 12 generally provides improved thermal aging resistance, chemical resistance, and resistance to electrical arc tracking.

In one embodiment, the polyimide-to-metal ("PTM") bonding layer, polyimide core layer and the adhesive primer layer are formed into a three layer film, where the fluoropolymer layers are each coated onto the polyimide layer as an aqueous dispersion. In addition, the high-temperature bonding layer is generally applied to one side of this three-layer laminate (also by aqueous dispersion). The resulting four-layer dielectric substrate can then be cut into tapes and spiral wrapped around a wire, cable or other electrical conductor. Thereafter, an outer layer comprising a PTFE base polymer layer can be applied separately as a porous, sinterable laminate tape and then partially or wholly sintered (and heat-sealed) generally under high temperature to wholly or partially densify and adhere the PTFE exterior layer to the other layers of the present invention.

Optional Innermost Layer (Polyimide-to-Metal or "PTM" Bonding Layer):

Particularly in wire/cable wrap applications, the optional polyimide-to-metal ("PTM") bonding layer is oftentimes used as the innermost layer, generally intended for placement substantially adjacent to an electrically conductive wire (or cable) located substantially at the center of a wrapped system. In a typical wire/cable wrap application, the wrapped conductive element generally comprises copper wire having a metal coating that serves to protect the copper from oxidation. The metal coating is oftentimes a high purity tin (typically applied by electroplating), where the conductive element has an operating temperature rating of up to 150° C.

For higher temperature ratings (up to 200° C.), silver is often used and for ratings up to 260° C., a nickel coating is generally used. Though the metal coating may be applied by dipping or other electroless method, the stranded copper wire is typically electroplated, and therefore will be described throughout as being plated with tin, silver or nickel.

Preferably, the polyimide-to-metal ("PTM") bonding layer is heat sealed or otherwise reliably bonded to the conductor material as part of the wire/cable wrap process. Ordinary skill and experimentation may be necessary in selecting the particular polyimide-to-metal ("PTM") bonding layer that (optimally) bonds to a particular conductive element to be wrapped.

In one embodiment, a FEP base polymer is used as a substantial (or entire) portion of the polyimide-to-metal ("PTM") bonding layer. In other embodiments, the polyimide-to-metal ("PTM") bonding layer will generally have a base polymer comprising about 50, 60, 70, 80, 90, 95, 96, 97, 98, 99, 99.5 or 100 weight percent FEP. Additional polymeric constituent(s), if any, comprise other fluoropolymers including, but not limited to, polytetrafluoroethylene (PTFE), poly(tetrafluoroethylene-co-perfluoro[alkyl vinyl ether]) (PFA) and poly(ethylene-co-tetrafluoroethylene) (ETFE).

The polyimide-to-metal ("PTM") bonding layer is preferably from about 0.25, 0.3, 0.4, 0.5, 0.75, 1, 2, 3, 4, or 5 to about 15, 20, 22 or 25.0 microns thick, more preferably from 8, 10 or 12 to about 14, 15, 16 or 17 microns thick.

The Polyimide Core Layer:

In one embodiment, the second layer (counting in the radial direction outward from the electrical conductor) the dielectric substrate, or laminate system, comprises one or more polyimides as the base polymer. This polyimide layer is generally referred to herein as the "core layer" or "polyimide core layer".

Generally, the polyimide core layer should be thick enough to provide electrical insulation properties and structural strength. However, the polyimide core layer generally must also be thin enough to be flexible and easily (and closely) molded to the article to be wrapped. Hence, the polyimide core layer will generally have a thickness in a range between (and including) any two of the following thicknesses (microns): 8, 10, 12, 15, 20, 25, 30, 40, 50, 60, 70, 75, 80, 90, 95, 100, 120, 125, 130, 135, 140, 145 and 150. In one embodiment, the core layer will be about 10 to 25 microns thick (e.g. 15 microns).

The polyimide core layer is generally derived from a polyamic acid precursor. The polyamic acid precursor can also comprise conventional (or non-conventional) catalysts and/or dehydrating agent(s). Methods for converting polyamic acid solutions into polyimide films are well known in the art and need not be discussed further here. Any conventional or non-conventional method for manufacturing polyimide film can be used to manufacture the core layer of the present invention.

In one embodiment, a polyamic acid precursor of about 5 to 40 percent by weight polymer solution dissolved in an organic solvent, according to methods well known in the art of polyimide film manufacture. The polyamic acid solution further comprises dehydrating agents, such as aliphatic acid anhydrides (acetic anhydride, etc.) or aromatic acid anhydrides. In such an embodiment, catalysts such as aliphatic tertiary amines (triethylamine, etc.), aromatic tertiary amines (dimethylaniline, etc) and heterocyclic tertiary amines (pyridine, picoline, isoquinoline, etc) are added to speed the drying process of the acid into a freestanding film. In such an embodiment, the dehydrating material can be used in slight molar excess, relative to the amount of amide acid groups in the polyamic acid. In this particular embodiment, about 2.0 to 3.0 moles of dehydrating material (per equivalent of polyamic acid) are useful. Generally, a comparable amount of tertiary amine catalyst is also useful.

In these embodiments, the polyamic acid solution is the (direct or indirect) reaction product of diamines and dianhydrides (or precursors or derivative thereof) dissolved in a polar solvent. Common diamines useful to make the polyimides of the present invention include:

1. 2,2 bis-(4-aminophenyl)propane;
2. 4,4'-diaminodiphenyl methane;
3. 4,4'-diaminodiphenyl sulfide (4,4'-DDS);
4. 3,3'-diaminodiphenyl sulfone (3,3'-DDS);
5. 4,4'-diaminodiphenyl sulfone;
6. 4,4'-diaminodiphenyl ether (4,4'-ODA);
7. 3,4'-diaminodiphenyl ether (3,4'-ODA);
8. 1,3-bis-(4-aminophenoxy)benzene (APB-134);
9. 1,3-bis-(3-aminophenoxy)benzene (APB-133);
10. 1,2-bis-(4-aminophenoxy)benzene;
11. 1,2-bis-(3-aminophenoxy)benzene;
12. 1,4-bis-(4-aminophenoxy)benzene;
13. 1,4-bis-(3-aminophenoxy)benzene;
14. 1,5-diaminonaphthalene;
15. 1,8-diaminonaphthalene;
16. 2,2'-bis(trifluoromethylbenzidine)
17. 4,4'-diaminodiphenyldiethylsilane;
18. 4,4'-diaminodiphenylsilane;
19. 4,4'-diaminodiphenylethylphosphine oxide;
20. 4,4'-diaminodiphenyl-N-methyl amine;
21. 4,4'-diaminodiphenyl-N-phenyl amine;
22. 1,2-diaminobenzene (OPD);
23. 1,3-diaminobenzene (MPD);
24. 1,4-diaminobenzene (PPD);
25. 2,5-dimethyl-1,4-diaminobenzene;
26. 2-(trifluoromethyl)-1,4-phenylenediamine;
27. 5-(trifluoromethyl)-1,3-phenylenediamine;
28. 2,2-Bis[4-(4-aminopnenoxy)phenyl]-hexafluoropropane;
29. 2,2-bis(3-aminophenyl)1,1,1,3,3,3-hexafluoropropane;
30. benzidine;
31. 4,4'-diaminobenzophenone;
32. 3,4'-diaminobenzophenone;
33. 3,3'-diaminobenzophenone;
34. m-xylylene diamine;
35. bisaminophenoxyphenylsulfone;
36. 4,4'-isopropylidenedianiline;
37. N,N-bis-(4-aminophenyl)methylamine;
38. N,N-bis-(4-aminophenyl)aniline
39. 3,3'-dimethyl-4,4'-diaminobiphenyl;
40. 4-aminophenyl-3-aminobenzoate;
41. 2,4-diaminotoluene;
42. 2,5-diaminotoluene;
43. 2,6-diaminotoluene;
44. 2,4-diamine-5-chlorotoluene;
45. 2,4-diamine-6-chlorotoluene;
46. 4-chloro-1,2-phenylenediamine;
47. 4-chloro-1,3-phenylenediamine;
48. 2,4-bis-(beta-amino-t-butyl)toluene;
49. bis-(p-beta-amino-t-butyl phenyl)ether;
50. p-bis-2-(2-methyl-4-aminopentyl)benzene;
51. 1-(4-aminophenoxy)-3-(3-aminophenoxy)benzene;
52. 1-(4-aminophenoxy)-4-(3-aminophenoxy)benzene;
53. 2,2-bis-[4-(4-aminophenoxy)phenyl]propane (BAPP);
54. bis-[4-(4-aminophenoxy)phenyl]sulfone (BAPS);
55. 2,2-bis[4-(3-aminophenoxy)phenyl]sulfone (m-BAPS);
56. 4,4'-bis-(aminophenoxy)biphenyl (BAPB);
57. bis(4-[4-aminophenoxy]phenyl)ether (BAPE);
58. 2,2'-bis-(4-aminophenyl)-hexafluoropropane (6F diamine);
59. 2,2'-bis-(4-phenoxy aniline)isopropylidene;
60. 2,4,6-trimethyl-1,3-diaminobenzene;
61. 4,4'-diamino-2,2'-trifluoromethyl diphenyloxide;
62. 3,3'-diamino-5,5'-trifluoromethyl diphenyloxide;
63. 4,4'-trifluoromethyl-2,2'-diaminobiphenyl;
64. 4,4'-oxy-bis-[(2-trifluoromethyl)benzene amine];
65. 4,4'-oxy-bis-[(3-trifluoromethyl)benzene amine];
66. 4,4'-thio-bis-[(2-trifluoromethyl)benzene-amine];
67. 4,4'-thiobis-[(3-trifluoromethyl)benzene amine];
68. 4,4'-sulfoxyl-bis-[(2-trifluoromethyl)benzene amine;
69. 4,4'-sulfoxyl-bis-[(3-trifluoromethyl)benzene amine];
70. 4,4'-keto-bis-[(2-trifluoromethyl)benzene amine];
71. 9,9-bis(4-aminophenyl)fluorene;
72. 1,3-diamino-2,4,5,6-tetrafluorobenzene;
73. 3,3'-bis(trifluoromethyl)benzidine; and the like.

Common dianhydrides useful to make the polyamic acids (and after drying and curing the polyimides of the present invention) include:

1. pyromellitic dianhydride (PMDA);
2. 3,3',4,4'-biphenyl tetracarboxylic dianhydride (BPDA);
3. 3,3',4,4'-benzophenone tetracarboxylic dianhydride (BTDA);

4. 4,4'-oxydiphthalic anhydride (ODPA);
5. 3,3',4,4'-diphenylsulfone tetracarboxylic dianhydride (DSDA);
6. 4,4'-(4,4'-isopropylidenediphenoxy)bis(phthalic anhydride) (BPADA);
7. 2,3,6,7-naphthalene tetracarboxylic dianhydride;
8. 1,2,5,6-naphthalene tetracarboxylic dianhydride;
9. 1,4,5,8-naphthalene tetracarboxylic dianhydride;
10. 2,6-dichloronaphthalene-1,4,5,8-tetracarboxylic dianhydride;
11. 2,7-dichloronaphthalene-1,4,5,8-tetracarboxylic dianhydride;
12. 2,3,3',4'-biphenyl tetracarboxylic dianhydride;
13. 2,2',3,3'-biphenyl tetracarboxylic dianhydride;
14. 2,3,3',4'-benzophenone tetracarboxylic dianhydride;
15. 2,2',3,3'-benzophenone tetracarboxylic dianhydride;
16. 2,2-bis(3,4-dicarboxyphenyl)propane dianhydride;
17. 1,1-bis(2,3-dicarboxyphenyl)ethane dianhydride;
18. 1,1-bis(3,4-dicarboxyphenyl)ethane dianhydride;
19. bis(2,3-dicarboxyphenyl)methane dianhydride;
20. bis(3,4-dicarboxyphenyl)methane dianhydride;
21. 4,4'-(hexafluoroisopropylidene)diphthalic anhydride (6FDA);
22. bis(3,4-dicarboxyphenyl)sulfoxide dianhydride;
23. tetrahydrofuran-2,3,4,5-tetracarboxylic dianhydride;
24. pyrazine-2,3,5,6-tetracarboxylic dianhydride;
25. thiophene-2,3,4,5-tetracarboxylic dianhydride;
26. phenanthrene-1,8,9,10-tetracarboxylic dianhydride;
27. perylene-3,4,9,10-tetracarboxylic dianhydride;
28. bis-1,3-isobenzofurandione;
29. bis(3,4-dicarboxyphenyl)thioether dianhydride;
30. bicyclo[2.2.2]oct-7-ene-2,3,5,6-tetracarboxylicdianhydride;
31. 2-(3',4'-dicarboxyphenyl)5,6-dicarboxybenzimidazole dianhydride;
32. 2-(3',4'-dicarboxyphenyl)5,6-dicarboxybenzoxazole dianhydride;
33. 2-(3',4'-dicarboxyphenyl)5,6-dicarboxybenzothiazole dianhydride;
34. bis(3,4-dicarboxyphenyl)2,5-oxadiazole 1,3,4-dianhydride;
35. bis 2,5-(3',4'-dicarboxydiphenylether)1,3,4-oxadiazole dianhydride;
36. and the like;
37. their acid ester and their acid chloride derivatives.

In one embodiment, the preferred diamines to form the polyamic acid are 4,4'-diaminodiphenyl ether and p-phenylene diamine. The preferred dianhydrides are pyromellitic dianhydride and 3,3'4,4'-biphenyltetracarboxylic dianhydride. Generally, the resulting polyimide films formed therefrom are sufficiently flexible to conform as a wire wrap core layer while also having advantageous modulus and mechanical toughness compared to many other polymer (and polyimide) systems.

Useful commercially available polyimides core layers include Kapton® films, available for E.I. du Pont de Nemours and Company of Wilmington, Del., USA. In particular, any high modulus Kapton® film (meaning a film with greater than 700 kpsi modulus) is generally particularly useful, due to the desirable mechanical toughness. However, other polyimide films, films with lower modulus, may also be used.

The polyimide core layer may have its surface modified to improve adhesion of the core layer to other layers. For example, prior to applying a polyimide-to-metal bonding layer or adhesive primer layer using an aqueous dispersion coating technique, the polyimide film can be subjected to a pre-treatment step. These pre-treatments steps include, but are not limited to, corona treatment, plasma treatment under atmospheric pressure, plasma treatment under reduced pressure, treatment with coupling agents like silanes and titanates, sandblasting, alkali-treatment, and acid-treatment. Such pre-treatment steps are well known in the art and need not be discussed further herein.

To improve the adhesion strength between the core layer and the adjacent bonding layers, it is also possible to add various organic and/or inorganic metal compounds (e.g. metal oxides and/or metal complexes). Addition of these metal compounds is disclosed for example in U.S. Pat. No. 4,742,099 (tin compounds, titanium compounds, etc.). Commonly, these metal compounds are added to the polyamic acid or are applied to an uncured wet film. Addition of organic compounds, used to improve adhesion strength between the core layer and the adjacent bonding layers, is discussed in U.S. patent application Ser. No. 10/150,233 entitled "A Laminate Structure Made From a Highly Bondable Polyimide, The Laminate Structure Exhibiting Improved Adhesive Strength" pending, filed May 17, 2002 and U.S. patent application Ser. No. 09/848,895 entitled "Polyimide Composition Having Improved Peel Strength With Clad", pending, filed May 4, 2001.

The Optional Adhesive Primer Layer and Polyimide-to-Metal (PTM) Layer:

In accordance with one embodiment of the present invention, the polyimide core layer's exterior surfaces are optionally coated with an adhesive primer layer and a polyimide-to-metal bonding layer.

The polyimide-to-metal ("PTM") bonding layer and the adhesive primer layer can be the same or different, provided however that each comprise about 50, 60, 70, 80, 90, 95, 96, 97, 98, 99, 99.5 or 100 weight percent FEP. Additional polymeric constituent(s), if any, comprise other fluoropolymers including, but not limited to, polytetrafluoroethylene (PTFE), poly(tetrafluoroethylene-co-perfluoro[alkyl vinyl ether]) (PFA) and poly(ethylene-co-tetrafluoroethylene) (ETFE).

The adhesive primer layer and the polyimide-to-metal bonding layer are preferably from 0.25, 0.5, 0.75, 1, 2, 3, 4, or 5 to 6, 8, 10, 12, 14, 16, 18, 20, 22 or 25 microns thick, and in one embodiment from 8, 10 or 12 to 15, 16 or 17 microns thick.

In one embodiment, the polyimide-to-metal ("PTM") bonding layer and the adhesive primer layer can be conveniently applied to the polyimide core layer as an aqueous dispersion comprising a colloidal FEP polymer. The applied dispersion will generally have a thickness from about 0.02, 0.05. 0.075, or 0.1 to about 0.12, 0.13, 0.14, or 0.15 mil (about 0.5 to about 3.75 microns).

Oftentimes, these layers will be applied from 0.03 to 0.06 mil (about 0.75 to about 1.5 microns) thick. The double side coated polyimide film can then be heated to a temperature in a range from about 325° C. to about 450° C. (preferrably 370° C. to 450° C.) for about 0.25 to 5 minutes.

The optional adhesive primer layer can be specifically designed so that the bonding temperature of that layer to the adjacent polyimide layer is low (i.e. in a range between and including any two of the following temperatures 375° C., 380, 385, 390, 395, 400, 405, 410, 415, 420 and 425° C.).

In many embodiments, a bonding temperature in a range of between 400 to 410° C. can be particularly useful. Oftentimes, optimum bonding temperatures are below 425° C. so that the polyimide layer is not degraded during construction of the overall laminate.

The optional adhesive primer layer (e.g., FEP) generally provides excellent bonding of the polyimide core layer and the subsequently applied high-temperature bonding layer. In addition, the polyimide-to-metal layer provides excellent bonding of the polyimide core layer to the wire, electrical conductor, or metal substrate.

The polyimide-to-metal (PTM) layer can also be used in the multilayer structures of the present invention to facilitate stripping of the insulation from the electrical conductor when used in commercial applications.

High-Temperature Bonding Layer:

The high-temperature bonding layer is also referred to herein as the polyimide-to-fluoropolymer ("PTF") bonding layer in cases where the (optional) fluoropolymer exterior layer is applied. The resulting PTF bonding layer (or high temperature bonding layer) provides improved bonding performance between the exterior fluoropolymer layer (e.g. PTFE) and the interior polyimide core layer. The PTF bonding layer is preferably PFA, and may optionally be blended with FEP fluoropolymer. The PTF bonding layer provides the dielectric substrate with excellent resistance to mechanical degradation, especially scrape abrasion and cut-through.

In one preferred embodiment, the high-temperature bonding layer (or the PTF layer) is optionally blended with FEP to form a PFA/FEP blended fluoropolymer. The high-temperature bonding layer has at least 40, 45, 50, 55, 60, 65, 70, 75, 80, 85, 90, 95, or 100 weight percent of PFA copolymer. However, up to 60 weight percent of the high-temperature bonding layer may be FEP or a fluoropolymer selected from the group consisting of polytetrafluoroethylene (PTFE) and poly(ethylene-co-tetrafluoroethylene) (ETFE).

In one embodiment, the PFA/FEP blend consists of from 50, 55, 60, 65, or 70 wt. percent to about 75, 80, 85 or 90 percent by weight PFA. In this embodiment, the FEP copolymer ranges from 10, 15, 20 or 25 to 30, 35, 40, 45 or 50 weight percent.

Suitable FEP copolymers useful as a blend components are commercially available as Teflon™ TE-5582, Teflon™ TE-9503, and Teflon™ 120, available from E.I. du Pont de Nemours & Company, Wilmington, Del., USA.

PFA may be derived from aqueous dispersion of a commercial PFA material, such as Teflon® 322J, available from E.I. du Pont de Nemours and Company of Wilmington, Del., USA.

The PTF bonding layer (e.g., PFA/FEP blend layer) can be subsequently applied to the adhesive primer layer (FEP) or directly to the polyimide core layer as a colloidal aqueous dispersion. These dispersions typically have a solids content of from about 5, 10, 15, 20 or 25 weight percent to about 30, 35, 40 45, 50, 55, or 60 weight percent. Thereafter heating is applied to the dispersed layer from 350° C. to 500° C. for about 0.50 to 5 minutes.

For the PTF bonding layers (or high temperature bonding layers) of the present invention, the PFA should generally have a melting point in a range between (and including) any two of the following temperatures (° C.): 220, 225, 230, 240, 250, 260, 270, 280, 290, 295, 300, 305, 310, 315 and 320° C.

The PTF bonding layer (e.g., PFA/FEP layer) may be applied by either coating or lamination techniques.

The PTF bonding layer (or high-temperature bonding layer) will generally have a thickness in a range between (and including) any two of the following thicknesses (in microns): 0.25, 0.3, 0.4, 0.5, 0.6, 0.7, 0.8, 0.9, 1.0, 1.25, 1.5, 1.75, 2, 3, 4, 5, 10, 11, 12, 13, 14, 15, 16, 17, 18, 19, 20, 21, 22, 23, 24 and 25 microns. A useful thickness range is oftentimes in a range from about 0.75 microns to 2.5 microns (generally in the range of about 0.03 to about 0.10 mils). In practice, the desired thickness can depend upon the particular wire specifications, particularly for military or commercial aircraft applications.

In one embodiment, the high-temperature bonding layer contains 90 weight percent PFA where the remainder is FEP. This particular formulation improves the peel strength for the overall laminate structure.

The peel strengths of the laminate structures using the first exterior layer described above showed peel strengths greater than or equal to 2, 3, 4, 5, 6, 7, 8, 9, or 10 pounds per linear inch ("pli").

The improved peel values observed at room temperature (as a result of using the first exterior layers described above) generally correlate to improved bond values of the overall laminate structure at extreme temperature conditions. Extreme high and low temperature conditions are typically encountered in certain high performance (i.e., aerospace and aircraft) applications where wire wrap compositions are heated and cooled very rapidly. The improved peel strengths discovered in the laminates of the present invention also provide improved resistance to scrape abrasion and ease of stripping of the laminate system from a wire without delamination of individual layers.

Improved scrape abrasion resistance (i.e. improved resistance to ultimate mechanical failure of the insulation system) generally can be particularly useful in applications where unwanted electrical arc tracking (seen when the insulation is mechanically degraded) is of great concern.

The Exterior Layer:

In accordance with one embodiment of the present invention, the PTF bonding layer, the polyimide core layer, and optional adhesive primer layer and polyimide-to-metal layer is generally applied to the wire/cable as a wrapped tape. Next, typically in the opposite direction, the exterior layer is also wrapped around the already insulated electrical conductor.

In this embodiment, the exterior layer comprises a sintered or sinterable fluoropolymer base polymer, such as, polytetrafluoroethylene ("PTFE"). PTFE layers can be useful due to their high melting point. While a pure PTFE layer can provide a melting point greater than 300° C., other fluoropolymers may be blended with the PTFE to obtain a variety of desired properties. Typically, the viscosity of the PTFE is a range on the order of from about $10^8$ GPa·s to $10^{14}$ GPa·s, more preferably from about $10^{10}$ GPa·s to $10^{12}$ GPa·s, most preferably $1^{11}$ GPa·s.

Other possible fluoropolymers that can optionally be blended with the PTFE include FEP, PFA, ETFE, and other thermally compatible TFE copolymers.

The exterior layer can also be a copolymer made of hexafluoropropylene and tetrafluoroethylene (FEP) comprising about 5 to 50 weight percent hexafluoropropylene and about 95 to 50 weight percent tetrafluoroethylene.

The exterior layer will generally provide some scrape abrasion resistance, chemical resistance, and thermal durability when the structure is wrapped about a wire or cable or the like. Used as an exterior layer, the thickness is generally from 1 to 200 microns. Useful thicknesses are generally from about 2, 5, 7, 10, 15, or 25 to about 30, 35, 40, 45 or 50 microns.

Filler Materials:

In some embodiments of the present invention, additives can be incorporated into one or more of the laminate fluoropolymer layers, or the polyimide core layer, to improve the performance of any particular layer at elevated temperatures. Useful additives include minerals having outgas properties at the temperature of an electrical arc, such as carbonates that evolve carbon dioxide (e.g., calcium or magnesium carbonate, or hydrated fillers or minerals containing water). Other useful additives may include alumina oxide, titanium dioxide, fumed alumina oxides, carbon, electrically conductive powders, electrically conductive polymers and the like.

Yet, other potentially suitable additives would include polymers which, like PTFE itself, decompose without producing carbonaceous or other conductive by-products upon decomposition. These additives may be incorporated into the fluoropolymer layers of the claimed composite, particularly in that layer nearest the conductor to be insulated.

For example, one or more pigments may be incorporated into any of the fluoropolymer layers or the polyimide core layer, such as, for purposes of laser marking. Such pigment may comprise 3 to 15% by weight of a fluoropolymer film (or layer), preferably 4 to 10% by weight, and most preferably 4 to 8% by weight. For example, an exterior fluoropolymer layer made of PTFE may be used which incorporates one pigment to make the layer white laser markable.

Alternatively, two layers can be used for this purpose, each incorporating different pigments of contrasting colors. Laser etching of the outermost pigmented layer could then reveal the contrasting color for identification of the wire type. In some embodiments, the outermost pigmented layer should not be thicker than about 8 microns in order to obtain sharp definition of the identifying code at the energy density of lasers presently commercially available.

Forming an Electrically Insulative Tape and Wrapping a Wire or Conductor:

The dielectric substrates of the present invention are generally useful for electrical insulation purposes. The structures can be slit into narrow widths to provide tapes. These tapes can then be wound around an electrical conductor in spiral fashion or in an overlapped fashion. The amount of overlap can vary, depending upon the angle of the wrap. The tension employed during the wrapping operation can also vary widely, ranging from just enough tension to prevent wrinkling, to a tension high enough to stretch and neck down the tape.

Even when the tension is low, a snug wrap is possible since the tape will often shrink under the influence of heat during any ensuing heat-sealing operation. Heat-sealing of the tape can be accomplished by treating the tape-wrapped conductor at a temperature and time sufficient to fuse the high-temperature bonding layer to the other layers in the composite.

The heat-sealing temperature required ranges generally from 240, 250, 275, 300, 325 or 350° C. to 375, 400, 425, 450, 475 or 500° C., depending upon the insulation thickness, the gauge of the metal conductor, the speed of the production line and the length of the sealing oven.

EXAMPLES

The insulated wires in the following EXAMPLES were tested for several properties including resistance to scrape abrasion and lamination adhesion strength between the polyimide and fluoropolymer layers.

Resistance to mechanical scrape abrasion is measured using a piece of equipment similar to equipment made available by General Electric sold as a Repeated Scrape Abrasion Tester, Cat. No. 158I238G1. In the EXAMPLES below, the scrape abrader was fitted with a 0.5-mm (0.019-inch) diameter abrading mandrel. The weight applied to the mandrel was 800 grams. The wire was positioned in the testing equipment and the equipment was started. The number of 'cycles' needed to remove the insulation and expose the conductor was recorded as the scrape abrasion number.

The present inventor has found that adhesion strength in the dielectric substrate laminate directly correlates to performance in scrape abrasion resistance as well as the overall usefulness of the dielectric substrate as an insulative wrap for wire and a substrate for an electronic device.

The test method below is used to measure the adhesion between various layers of certain polyimide-fluoropolymer laminate structures and is herein referred to as the "adhesion test method". This test uses a robotic heat-sealing device (similar to Pack Rite Machines Model RT) and a tensile testing machine (similar to Instron Model 1122).

Test materials are cut into long narrow strips approximately six inches long and one inch wide. The strips are positioned one directly on top of the other. This is called a test stack. One end of the test stack (approximately one-inch long) is placed in a robotic heat sealer where it is pressed between two heated metal bars. The pressure between these bars, the temperature of the bars, and the time that the pressure is applied to the bars, are all carefully controlled. The test stack is pressed together and removed from the heat sealer. The test specimen has one fused end with a strip of each lamination test material protruding outward from the sealed material.

Next, the test specimen is mounted in a tensile testing machine by attaching one of the "free" ends of the lamination strips to one jaw, and the other free end of the lamination strips to the other jaw. The tensile tester is then started and the jaws begin to move in opposing directions. During this time the tensile force between the jaws is measured and recorded.

The tensile force represents the adhesion between the various laminate layers (i.e. higher adhesion values will give higher tensile force values). The highest tension value is selected and reported as the adhesion value for the specimen. Normally, five specimens are tested and the average of the five becomes the reported adhesion value of the test materials.

Nothing within the foregoing discussion is intended to limit the present invention. Rather, the scope of the present invention is intended exclusively according to the following claims below.

Example 1

A polyimide-fluoropolymer insulation tape having a high modulus polyimide film layer, a high-temperature bonding layer made from a blend of PFA and FEP, and adjacent adhesive primer layer and a polyimide-to-metal (PTM) layer made of FEP, and a sintered PTFE layer adjacent to the high-temperature bonding layer was constructed.

The polyimide film thickness was nominally 0.65 mils in thickness and had a modulus over 800 kpsi.

A thin layer of aqueous based fluorinated ethylene-propylene (FEP), approximately 0.07 mils thick (final dry thickness) was applied to both sides of the polyimide film layer to form both the adhesive primer layer and the polyimide-to-metal (PTM) layer on the polyimide layer. These two coating layers were fused to the polyimide film using a vertical radiant-heat, curing oven at a maximum film temperature of 410° C.

A layer containing 10% by weight FEP and 90% of perfluoroalkoxy-fluorocarbon (PFA) was coated over the adhesive primer layer as an aqueous solution to form a high-temperature bonding layer. The high-temperature bonding layer was approximately 0.07 mils thick. Next, the polyimide layer (and adhesive primer layer and polyimide-to-metal layer) and the high-temperature bonding layer was cut into a tape and wrapped around a wire.

The wire conductor was a 24 AWG nickel-plated 19–36 stranded conductor. The electrically insulative tape was applied to the conductor in spiral wrapped manner to allow the tape to overlap itself by more than 50% forming "double-layer" insulation.

Next, unsintered PTFE tape, measuring 2.0 mils in thickness, was layered onto the coated wire as a tape. The PTFE was adhered to the high-temperature bonding layer using heat and pressure. The PTFE tape was white laser markable. The PTFE outer tape was applied in much the same manner as the first tape except it was applied in the opposite direction (cross-wrapped).

The heating process was completed in an electric radiant vertical oven, 10 feet in height, with air temperatures ranging from 480 to 540° C. The processing speed of the coated wire through the oven was about 40 feet/minute.

The average number scrape abrasion cycles of EXAMPLE 1 was 111 cycles. This number represents an increase of approximately 20% in scrape abrasion compared to similar wires made using high tensile strength polyimide and standard FEP coatings.

Example 2

EXAMPLE 2 was constructed as a laminate system and was not wrapped onto a wire. The difference between EXAMPLE 2 and EXAMPLE 1 is discussed below. In EXAMPLE 2, a four-layer composite was laminated to an exterior PTFE layer. The four-layer composite consisted of two coating layers (i.e. the adhesive primer layer and the polyimide-to-metal (PTM) layer), the polyimide core layer, and the high-temperature bonding layer (PFA/FEP). These four layers were fused to an exterior layer (PTFE) at a maximum film temperature of 375° C., at 10 psi, for 10 seconds. However, the five-layer composite was not wrapped around a wire but kept as a sheet laminate.

The peel strength of the overall laminate structure, without the wire conductor, was measured at 1988 g/in. according to the adhesion test method.

Example 3

EXAMPLE 3 was constructed in accordance with EXAMPLE 2. The difference regarding EXAMPLE 3 is that the lamination conditions had a maximum film temperature of 375° C., at only 3 psi, for 10 seconds.

The peel strength of the overall laminate structure, without the wire conductor, was measured at 1759 g/in. according to the adhesion test method.

Comparative Example 1

The electrically insulative substrate of this COMPARATIVE EXAMPLE was prepared in accordance with EXAMPLE 1 (i.e. wrapped around a wire and measure for scrape abrasion resistance) except for the following.

A thin layer, approximately 0.10 mils thick (final dry thickness) of aqueous based fluorinated ethylene-propylene (FEP) was applied to both sides of the polyimide material to form the polyimide-to-metal (PTM) layer and a "bonding layer" made of pure FEP (no PFA). The "bonding layer" took the place of both the adhesive primer layer and the high temperature bonding layer (the PTF layer) of EXAMPLE 1.

The coating layers were fused to the polyimide film using a vertical radiant-heated curing oven at a maximum film temperature of approximately 410° C. The laminate was cut into tapes and wrapped around a wire in accordance with EXAMPLE 1.

A PTFE tape, 2.0-mil thick (nominal) unsintered laser-markable tape, was wrapped in the same manner as EXAMPLE 1.

The fused wire was tested for scrape abrasion resistance. The average number of cycles to failure with this wire insulation was observed to be in the range from 65 to 92 cycles.

Comparative Example 2

COMPARATIVE EXAMPLE 2 was prepared in accordance with COMPARATIVE EXAMPLE 1. However, a thin layer, approximately 0.07 mils thick (final dry thickness) of aqueous based fluorinated ethylene-propylene (FEP), with no (PFA) was applied to both sides of the polyimide film. The coating layers were fused to the polyimide film using a vertical radiant heated curing oven at a maximum film temperature of approximately 410° C.

Next, a second layer of aqueous based FEP fluoropolymer was top coated over the adhesive primer layer of FEP. The thickness of the topcoat layer was thus increased to the thickness of approximately 0.14 mils. The electrically insulative composite was wrapped around a wire in accordance with EXAMPLE 1.

The PTFE tape, 2.0-mil thick (nominal) unsintered laser-markable tape, was wrapped around the insulated wire in accordance with EXAMPLE 1.

The taped conductor was then exposed to a heating process to fuse the PI-FP tape and sinter the PTFE tape. This heating process was completed in an electric radiant vertical oven, 10 feet in height, with the air temperatures inside of the oven ranging from 480 to 540° C. The linear speed of the wire through the oven was 40 feet/minute.

The fused wire was tested for scrape abrasion resistance. The average number of cycles to failure with this wire insulation was observed as 89 cycles.

Comparative Example 3

COMPARATIVE EXAMPLE 3 was prepared in accordance with EXAMPLE 2 except that the high-temperature bonding layer did not contain any PFA and was made purely of FEP copolymer. The maximum film temperature used was in accordance with the lamination conditions of EXAMPLE 2. The lamination conditions were set at 375° C., 10 psi and 10 seconds.

The peel strength of the overall laminate structure however, again without the wire conductor, was measured at only 1225 g/in. according to the adhesion test method. This value is notably lower than the peel strength number of EXAMPLE 2 (1988 g/in.).

Comparative Example 4

COMPARATIVE EXAMPLE 4 was prepared in accordance with EXAMPLE 3 except the maximum film temperature was set at 375° C., 3 psi, and 10 seconds. Again, the high-temperature bonding layer (the PTF layer) was pure FEP copolymer.

The peel strength of the overall laminate structure, without the wire conductor, was measured at 1261 g/in. according to the adhesion test method. This value is notably lower than the peel strength number of EXAMPLE 3 (1759 g/in).

What is claimed is:

1. A dielectric substrate useful for wrapping wire or cable or for supporting electronic circuitry, the substrate comprising:
   a. a polyimide layer having a thickness in a range between and including any two of the following thicknesses: 8, 10, 12, 15, 20, 25, 30, 40, 50, 60, 70, 75, 80, 90, 95, 100, 120, 125, 130, 135, 140, 145 and 150 microns;
   b. a high-temperature bonding layer having:
      i. a thickness between and including any two of the following numbers: 0.25, 0.5, 0.75, 1, 2, 3, 4, 5, 6, 8, 10, 12, 14, 16, 18, 20, 22 and 25 microns;
      ii. a melting point in a range between and including any two of the following temperatures: 220, 225, 230, 240, 250, 260, 270, 280, 290, 295, 300, 305, 310, 315 and 320° C.; and
      iii. the high-temperature bonding layer comprising a high temperature base polymer comprising poly(tetrafluoroethylene-co-perfluoro[alkyl vinyl ether]) (PFA) in a concentration range between and including any two of the following weight percentages (based upon the total amount of high temperature base polymer): 65, 70, 75, 80, 85, 90, 95, 96, 97, 98, 99 and 100; and optionally blended with poly(tetrafluoroethylene-co-hexafluoropropylene) (FEP) in an amount in a range between (and including) any two of the following weight percentages (based upon total weight of high temperature base polymer): 0, 1, 2, 3, 4, 5, 10, 15, 20, 25, 30, 35, 40, and 45,
   c. an adhesive primer layer in contact with and positioned between the polyimide layer and the high-temperature bonding layer, the adhesive primer layer having an adhesive primer base polymer comprising about 70, 80, 90, 95, 96, 97, 98, 99, 99.5 or 100 weight percent poly(tetrafluoroethylene-co-hexafluoropropylene) (FEP), optionally blended with a second copolymer selected from the group consisting of: polytetrafluoroethylene (PTFE), poly(tetrafluoroethylene-co-perfluoro[alkyl vinyl ether]) (PFA); poly(ethylene-co-tetrafluoroethylene) (ETFE) and derivations or copolymers thereof, and
   d. a polyimide-to-metal ("PTM") bonding layer adjacent to the polyimide layer is on an opposite side of the high-temperature bonding layer, the polyimide-to-metal bonding layer comprising a base polymer comprising about 70, 80, 90, 95, 96, 97, 98, 99, 99.5 or 100 weight percent poly(tetrafluoroethylene-co-hexafluoropropylene) (FEP), optionally blended with a second polymer selected from the group consisting of: polytetrafluoroethylene (PTFE), poly(tetrafluoroethylene-co-perfluoro[alkyl vinyl ether]) (PFA); poly(ethylene-co-tetrafluoroethylene) (ETFE) and derivations or copolymers thereof, wherein the polyimide-to-metal (PTM) bonding layer has a thickness between and including any two of the following numbers 0.25, 0.3, 0.4, 0.5, 0.75, 1, 2, 3, 4, 5, 10, 15, 20, 22 or 25 microns.

2. A dielectric substrate in accordance with claim 1 further comprising an exterior layer of polytetrafluoroethylene (PTFE) having a thickness in a range between and including any two of the following: 1, 2, 5, 7, 10, 15, 20, 25, 30, 35, 40, 45, 50, 75, 100, 150, and 200 microns and wherein the exterior layer is adjacent to the high-temperature bonding layer.

3. A dielectric substrate in accordance with claim 2 wherein the exterior layer is partially or wholly sintered.

4. A dielectric substrate in accordance with claim 3 being further defined as a wrap for an electrical wire or cable to provide continuous, heat-sealable, electrical insulation.

5. An electrically insulated wire or cable wherein the dielectric substrate of claim 3 is in a form of an electrically insulative tape and wherein the tape is wrapped around the wire or cable.

6. A dielectric substrate in accordance with claim 2 being further defined as a wrap for an electrical wire or cable to provide continuous, heat-sealable, electrical insulation.

7. An electrically insulated wire or cable wherein the dielectric substrate of claim 2 is in a form of an electrically insulative tape and wherein the tape is wrapped around the wire or cable.

8. An electrically insulted wire or cable wherein the substrate of claim 2 is in the form of an electrically insulative tape, wherein the tape is wrapped around the wire or cable in an overlapped fashion by at least 50 to 100 percent.

9. A dielectric substrate in accordance with claim 1, wherein the polyimide-to-metal (PTM) base polymer consists essentially of poly(tetrafluoroethylene-co-hexafluoropropylene) (FEP).

10. A dielectric substrate in accordance with claim 1, wherein the adhesive primer base polymer consists essentially of poly(tetrafluoroethylene-co-hexafluoropropylene) (FEP).

11. A dielectric substrate in accordance with claim 1 being further defined as a wrap for an electrical wire or cable to provide continuous, heat-sealable, electrical insulation.

12. A dielectric substrate in accordance with claim 1 wherein the high-temperature bonding layer and the adjacent adhesive primer layer have a bond strength greater than or equal to 2, 3, 4, 5, 6, 7, 8, 9, or 10 pounds per linear inch.

13. An electrically insulated wire or cable wherein the dielectric substrate of claim 1 is in a form of an electrically insulative tape and wherein the tape is wrapped around the wire or cable.

14. A substrate in accordance with claim 1 wherein the polyimide layer further comprises a material selected from the group consisting of carbonates that evolve carbon dioxide, minerals containing water of hydration, and polymers that decompose without producing carbonaceous or other conductive by-products on decomposition.

* * * * *